(12) United States Patent
Ju et al.

(10) Patent No.: US 10,290,741 B2
(45) Date of Patent: May 14, 2019

(54) THIN FILM TRANSISTOR, ARRAY SUBSTRATE AND DISPLAY PANEL HAVING THE SAME, AND FABRICATING METHOD THEREOF

(71) Applicant: BOE TECHNOLOGY GROUP CO., LTD., Beijing (CN)

(72) Inventors: Changcheng Ju, Beijing (CN); Hu Meng, Beijing (CN); Yanzhao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/529,682

(22) PCT Filed: Nov. 8, 2016

(86) PCT No.: PCT/CN2016/105064
§ 371 (c)(1),
(2) Date: May 25, 2017

(87) PCT Pub. No.: WO2017/206439
PCT Pub. Date: Dec. 7, 2017

(65) Prior Publication Data
US 2018/0219100 A1    Aug. 2, 2018

(30) Foreign Application Priority Data
May 31, 2016 (CN) .......................... 2016 1 0374908

(51) Int. Cl.
*H01L 29/06* (2006.01)
*H01L 29/786* (2006.01)
(Continued)

(52) U.S. Cl.
CPC ........ *H01L 29/78618* (2013.01); *B82Y 10/00* (2013.01); *H01L 21/02631* (2013.01);
(Continued)

(58) Field of Classification Search
CPC ........... H01L 29/7869; H01L 29/66742; H01L 29/78696; H01L 29/66439; H01L 29/7613;
(Continued)

(56) References Cited

U.S. PATENT DOCUMENTS

| 2004/0118448 A1* | 6/2004 | Scher | ................... B82Y 10/00 136/252 |
| 2007/0108435 A1* | 5/2007 | Harmon | ................. B82Y 10/00 257/9 |

(Continued)

FOREIGN PATENT DOCUMENTS

| CN | 103579358 A | 2/2014 |
| CN | 104900709 A | 9/2015 |

(Continued)

OTHER PUBLICATIONS

International Search Report & Written Opinion dated Mar. 3, 2017, regarding PCT/CN2016/105064.

(Continued)

*Primary Examiner* — Brian Turner
(74) *Attorney, Agent, or Firm* — Intellectual Valley Law, P.C.

(57) ABSTRACT

The present application discloses a thin film transistor including a base substrate and an active layer on the base substrate having a first portion corresponding to a channel region, a second portion corresponding to a source electrode contact region, and a third portion corresponding to a drain electrode contact region. The second portion and the third portion include a three-dimensional nanocomposite material having a semiconductor material matrix and a plurality of nanopillars in the semiconductor material matrix.

18 Claims, 2 Drawing Sheets

(51) Int. Cl.
*H01L 29/04* (2006.01)
*H01L 29/93* (2006.01)
*H01L 29/66* (2006.01)
*H01L 21/02* (2006.01)
*H01L 29/24* (2006.01)
*H01L 29/267* (2006.01)
*H01L 29/45* (2006.01)
*B82Y 10/00* (2011.01)
*G02F 1/1368* (2006.01)

(52) U.S. Cl.
CPC .......... *H01L 29/0676* (2013.01); *H01L 29/24* (2013.01); *H01L 29/267* (2013.01); *H01L 29/45* (2013.01); *H01L 29/66969* (2013.01); *H01L 29/786* (2013.01); *H01L 29/7869* (2013.01); *H01L 29/78696* (2013.01); *G02F 1/1368* (2013.01); *G02F 2202/36* (2013.01); *H01L 21/02554* (2013.01); *H01L 21/02565* (2013.01)

(58) Field of Classification Search
CPC ............... H01L 29/127; H01L 29/0665; H01L 29/41725; H01L 29/4232; B82Y 10/00; B82Y 40/00
See application file for complete search history.

(56) References Cited

U.S. PATENT DOCUMENTS

| | | | | |
|---|---|---|---|---|
| 2008/0237595 A1* | 10/2008 | Park | ................... | H01L 29/7869 257/57 |
| 2009/0109435 A1* | 4/2009 | Kahen | .................. | C09K 11/883 356/317 |
| 2009/0224301 A1* | 9/2009 | Yamakawa | ....... | H01L 27/11502 257/295 |
| 2010/0084655 A1* | 4/2010 | Iwasaki | ............. | H01L 29/78618 257/43 |
| 2014/0034944 A1 | 2/2014 | Zan et al. | | |
| 2014/0083971 A1* | 3/2014 | Fujii | ...................... | C09K 13/08 216/13 |
| 2014/0251436 A1* | 9/2014 | Hamada | .............. | H01L 31/0328 136/265 |
| 2015/0236128 A1* | 8/2015 | Wang | ................ | H01L 21/02694 257/66 |
| 2016/0043207 A1 | 2/2016 | Kim et al. | | |

FOREIGN PATENT DOCUMENTS

CN 105118780 A 12/2015
CN 105493256 A 4/2016

OTHER PUBLICATIONS

"Progress of Research on the Electrode of Ba1—xSrxTio3 (BST) Ferroelectric Thin Film", Liqiang Xin et al., vol. 27, No. 3, Bulletin of the Chinese Ceramic Society (Jun. 2008).

"Epitaxial Photostriction-Magnetostriction Coupled Self Assembled Nanostructures", Heng-Jui Liu et al, ACS Nano, 6:8, 6952-6959, (Jul. 1, 2012).

"Tuning Electronic Transport in a Self-Assembled Nanocomposite", Wei Sea Chang et al., ACS Nano, 8:6, 6242-6249, (May 19, 2014).

"Promising electron field emitters composed of conducting perovskite LaNiO3 shells on ZnO nanorod arrays", Tung-Han Yang et al., Journal of Materials Chemistry, 22,17071-17078 (2012).

* cited by examiner

THIN FILM TRANSISTOR, ARRAY SUBSTRATE AND DISPLAY PANEL HAVING THE SAME, AND FABRICATING METHOD THEREOF

CROSS-REFERENCE TO RELATED APPLICATION

This application is a national stage application under 35 U.S.C. § 371 of International Application No. PCT/CN2016/105064 filed Nov. 8, 2016, which claims priority to Chinese Patent Application No. 201610374908.8, filed May 31, 2016, the contents of which are incorporated by reference in the entirety.

TECHNICAL FIELD

The present invention relates to a thin film transistor, an array substrate and a display panel having the same, and a fabricating method thereof.

BACKGROUND

Metal materials and semiconductor materials have different work functions. At an interface between a metal material and a semiconductor material in a conventional thin film transistor, electrons flow from a material having a lower work function to another material having a higher work function, until two Femi levels of two materials equilibrate to a same level through the local exchange of carriers. At the equilibration point, either an ohmic contact or a Schottky contact is formed at the interface.

Schottky contact resistance limits frequency response of an apparatus. Charging and discharging of Schottky contact resistance result in additional energy consumption. In contrast, ohmic contact does not produce significant additional impedance, and does not change the balanced carrier concentration in the active layer in any significant manner. Thus, the ohmic contact is the ideal contact type in a thin film transistor.

SUMMARY

In one aspect, the present invention provides a thin film transistor comprising a base substrate and an active layer on the base substrate having a first portion corresponding to a channel region, a second portion corresponding to a source electrode contact region, and a third portion corresponding to a drain electrode contact region, wherein the second portion and the third portion comprise a three-dimensional nanocomposite material comprising a semiconductor material matrix and a plurality of nanopillars in the semiconductor material matrix.

Optionally, the plurality of nanopillars extending substantially along a direction perpendicular to the base substrate.

Optionally, the plurality of nanopillars comprises an inorganic perovskite material.

Optionally, the inorganic perovskite material is one of $LaNiO_3$, $SrRuO_3$, $La_{0.67}Sr_{0.33}MnO_3$, superconducting yttrium-barium-copper-oxygen (YBCO), and superconducting lanthanum strontium cobalt oxide (LSCO).

Optionally, the semiconductor material matrix comprises a semiconductor material comprising $M1O_aN_b$, wherein M1 is a single metal or a combination of metals, a>0, and b≥0.

Optionally, the semiconductor material matrix comprises one or more of indium tin zinc oxide, hafnium indium zinc oxide, zinc oxide, and indium gallium zinc oxide.

Optionally, a volume ratio between the plurality of nanopillars and the semiconductor material matrix is in a range of approximately 3:7 to approximately 1:9.

Optionally, the plurality of nanopillars comprises $LaNiO_3$, and the semiconductor material matrix comprises zinc oxide; and a volume ratio between $LaNiO_3$ and zinc oxide is in a range of approximately 3:7 to approximately 1:9.

Optionally, the thin film transistor further comprises a source electrode in the source electrode contact region in direct contact with the second portion; and a drain electrode in the drain electrode contact region in direct contact with the third portion; wherein the source electrode and the drain electrode are made of a metal material.

Optionally, the source electrode and the drain electrode comprises one or more of molybdenum, gold, and aluminum.

Optionally, the first portion comprise a three-dimensional nanocomposite material comprising a semiconductor material matrix and a plurality of nanopillars in the semiconductor material matrix; and a volume ratio between the plurality of nanopillars and the semiconductor material matrix in the first portion is less than that in the second portion and the third portion.

Optionally, the first portion comprise a three-dimensional nanocomposite material comprising a semiconductor material matrix and a plurality of nanopillars in the semiconductor material matrix; and a distribution density of nanopillars in the second portion and the third portion is greater than that in the first portion.

Optionally, the base substrate is a single crystal perovskite base substrate or a base substrate comprising a perovskite buffer sub-layer.

Optionally, the single crystal perovskite base substrate or the perovskite buffer layer comprises $SiTiO_3$.

In another aspect, the present invention provides a method of fabricating a thin film transistor having an active layer including a first portion corresponding to a channel region, a second portion corresponding to a source electrode contact region, and a third portion corresponding to a drain electrode contact region; the method comprising forming the active layer; wherein forming the active layer comprises forming the second portion and the third portion using a three-dimensional nanocomposite material comprising a semiconductor material matrix and a plurality of nanopillars in the semiconductor material matrix.

Optionally, the plurality of nanopillars are formed to extend substantially along a direction perpendicular to the base substrate; and the plurality of nanopillars are formed using an inorganic perovskite material; wherein forming the active layer comprises co-depositing a semiconductor material and the inorganic perovskite material on a base substrate to form a three-dimensional nanocomposite composite layer comprising the semiconductor material and the inorganic perovskite material; and the base substrate is a single crystal perovskite base substrate or a base substrate comprising a perovskite buffer layer.

Optionally, the co-depositing is performed by pulsed laser deposition during which the inorganic perovskite material self-assembles into the plurality of nanopillars in the semiconductor material matrix.

Optionally, the pulsed laser deposition is performed at a laser pulse frequency and a deposition duration so that a volume ratio between the plurality of nanopillars and the semiconductor material matrix is in a range of approximately 3:7 to approximately 1:9.

Optionally, the pulsed laser deposition is performed at a deposition temperature in a range of approximately 600 degrees to approximately 700 degrees, and in an oxygen atmosphere under a pressure in a range of approximately 80 mTor to approximately 120 mTor.

In another aspect, the present invention provides a display panel comprising a thin film transistor described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional thin film transistors, ohmic contact may be achieved either by doping semiconductor material with a high doping concentration or by lowering the energy barrier at the metal-semiconductor interface. Both methods require a cumbersome fabricating process involving multiple patterning steps, during which the thin film transistor is prone to short circuit or other defects. The thin film transistor fabricated by the conventional methods typically has a relative large $I_{off}$, affecting display quality.

Accordingly, the present invention provides, inter alia, a thin film transistor, an array substrate and a display panel having the same, and a fabricating method thereof that substantially obviate one or more of the problems due to limitations and disadvantages of the related art. In one aspect, the present disclosure provides a thin film transistor including a base substrate, and an active layer on the base substrate having a first portion corresponding to a channel region, a second portion corresponding to a source electrode contact region, and a third portion corresponding to a drain electrode contact region. In some embodiments, the active layer includes a three-dimensional nanocomposite material having a semiconductor material matrix and a plurality of nanopillars in the semiconductor material matrix. Optionally, the second portion and the third portion of the active layer include a three-dimensional nanocomposite material having a semiconductor material matrix and a plurality of nanopillars in the semiconductor material matrix.

As used herein, the term "nanopillar" refers to an elongated, nanostructure that is substantially solid. In some embodiments, a nanopillar has a lateral dimension (e.g., a cross-sectional dimension in the form of a width or a diameter) in the nm range, and an aspect ratio that is about 2 or greater. Optionally, the nanopillar has a lateral dimension in a range of approximately 1 nm to approximately 100 nm, e.g., approximately 1 nm to approximately 50 nm, approximately 5 nm to approximately 50 nm, approximately 10 nm to approximately 30 nm, approximately 15 nm to approximately 20 nm. Optionally, the nanopillar has an aspect ratio in a range of approximately 2 to approximately 100, e.g., approximately 2 to approximately 50, approximately 50 to approximately 100, approximately 2 to approximately 25, approximately 2 to approximately 20, approximately 2 to approximately 10, approximately 3 to approximately 10. Optionally, the nanopillar has a length in a range of approximately 50 nm to 250 nm, e.g., approximately 50 nm to 150 nm.

Figure 1:
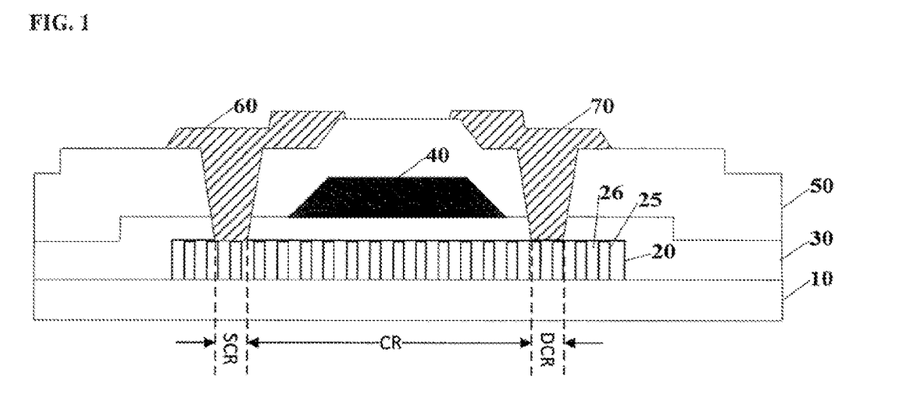
FIG. 1 is a cross-sectional view of a thin film transistor in some embodiments according to the present disclosure.

FIG. 1 is a cross-sectional view of a thin film transistor in some embodiments according to the present disclosure. Referring to FIG. 1, the thin film transistor in some embodiments includes a base substrate 10, an active layer 20 on the base substrate 10, a gate insulating layer 30 on a side of the active layer 20 distal to the base substrate 10, a gate electrode 40 on a side of the gate insulating layer 30 distal to the active layer 20, a passivation layer 50 on a side of the gate electrode 40 distal to the gate insulating layer 30, a source electrode 60 and a drain electrode 70 on a side of the passivation layer 50 distal to the gate electrode 40. The thin film transistor further includes a first via and a second via respectively extending through the passivation layer 50 and the gate insulating layer 30, the source electrode 60 being in contact with the active layer 20 through the first via, and the drain electrode 70 being in contact with the active layer 20 through the second via. The thin film transistor illustrated in FIG. 1 is a top gate-type thin film transistor. Optionally, the present thin film transistor may be a thin film transistor in a bottom gate-type thin film transistor.

Referring to FIG. 1, the active layer 20 includes a first portion corresponding to a channel region CR, a second portion corresponding to a source electrode contact region SCR, and a third portion corresponding to a drain electrode contact region DCR. The second portion and the third portion include a three-dimensional nanocomposite material layer having a semiconductor material matrix and a plurality of nanopillars 25 disposed in the semiconductor material matrix 26. In the present thin film transistor, the active layer, e.g., the source electrode contact region SCR and the drain electrode contact region DCR, is made of a three-dimensional nanocomposite material. The nanopillars 25 have a very high surface area-to-volume ratio, greatly facilitating injection of carriers between the active layer and the source and drain electrodes. Due to the presence of the nanopillars 25, injection of carriers occurs not only at the metal-semiconductor interface, but also at the nanopillar-semiconductor interface, significantly increasing the surface area for carrier injection and decreasing the metal-semiconductor resistance. As a result, the present thin film transistor has a lower threshold voltage and enhanced electrical properties.

In some embodiments, the plurality of nanopillars extending substantially along a direction perpendicular to the base substrate. For example, the plurality of nanopillars extend vertically from the base substrate 10, e.g., substantially perpendicularly to the base substrate 10 (e.g., angles between the nanopillars and the base substrate in a range of approximately 80 degrees to 90 degrees, e.g., approximately 85 degrees to 90 degrees). In some embodiments, the plurality of nanopillars are sandwiched between the base substrate 10 and the source electrode 60 in the source electrode contact region SCR, and between the base substrate 10 and the drain electrode 70 in the drain electrode contact region DCR. Optionally, the plurality of nanopillars are arranged between the base substrate 10 and the source electrode 60 in the source electrode contact region SCR so that each of the plurality of nanopillars includes a top end electrically connected to the source electrode 60. Optionally, the plurality of nanopillars are arranged between the base substrate 10 and the drain electrode 70 in the drain electrode contact region DCR so that each of the plurality of nanopillars includes a top end electrically connected to the drain electrode 70. Optionally, the plurality of nanopillars are arranged between the base substrate 10 and the source electrode 60 in the source electrode contact region SCR so that each of the plurality of nanopillars includes a bottom end electrically connected to the base substrate 10. Optionally, the plurality of nanopillars are arranged between the base substrate 10 and the drain electrode 70 in the drain electrode contact region DCR so that each of the plurality of nanopillars includes a bottom end electrically connected to the base substrate 10.

Various appropriate materials and various appropriate fabricating methods may be used to make the plurality of nanopillars in the semiconductor material matrix. In some embodiments, the plurality of nanopillars are made of a conductive material. Examples of appropriate materials for making the plurality of nanopillars include, but are not limited to, an inorganic perovskite material. Examples of appropriate inorganic perovskite materials include, but are not limited to, $LaNiO_3$, $SrRuO_3$, $La_{0.67}Sr_{0.33}MnO_3$, superconducting yttrium-barium-copper-oxygen (YBCO), and superconducting lanthanum strontium cobalt oxide (LSCO). Optionally, the inorganic perovskite material may be co-deposited with a semiconductor material on a base substrate to form the active layer. Optionally, the co-depositing is performed by pulsed laser deposition.

Various appropriate materials and various appropriate fabricating methods may be used to make the base substrate. Examples of appropriate materials for making the base substrate include, but are not limited to, an inorganic perovskite material. Examples of appropriate inorganic perovskite materials include, but are not limited to, $SiTiO_3$. In some embodiments, the base substrate is a single crystal perovskite base substrate, e.g., a base substrate comprising a (1,1,1) oriented $SiTiO_3$ single crystal base substrate. In some embodiments, the base substrate includes a perovskite buffer layer. For example, the base substrate may include a single crystal silicon sub-layer and a perovskite buffer layer on a side proximal to the active layer. Optionally, the perovskite buffer layer is a buffer layer including $SiTiO_3$.

Various appropriate semiconductor materials and various appropriate fabricating methods may be used to make semiconductor material matrix of the active layer. In some embodiments, the semiconductor material includes $M1O_aN_b$, wherein M1 is a single metal or a combination of metals, $a>0$, and $b \geq 0$, e.g., the semiconductor material is a metal oxide material or a metal oxynitride material. Examples of appropriate metal oxide materials include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:Nb, and Cd—Sn—O. Examples of appropriate metal oxynitride materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the semiconductor material matrix includes a semiconductor material providing a favorable environment for self-assembling of the plurality of nanopillars therein. Optionally, the semiconductor material matrix includes one or more of indium tin zinc oxide, hafnium indium zinc oxide, zinc oxide, and indium gallium zinc oxide.

Various appropriate conductive electrode materials and various appropriate fabricating methods may be used to make the source electrode and the drain electrode. In some embodiments, the conductive electrode material includes a metal material. Examples of appropriate metal materials include, but are not limited to, molybdenum, gold, and aluminum.

Figure 2:
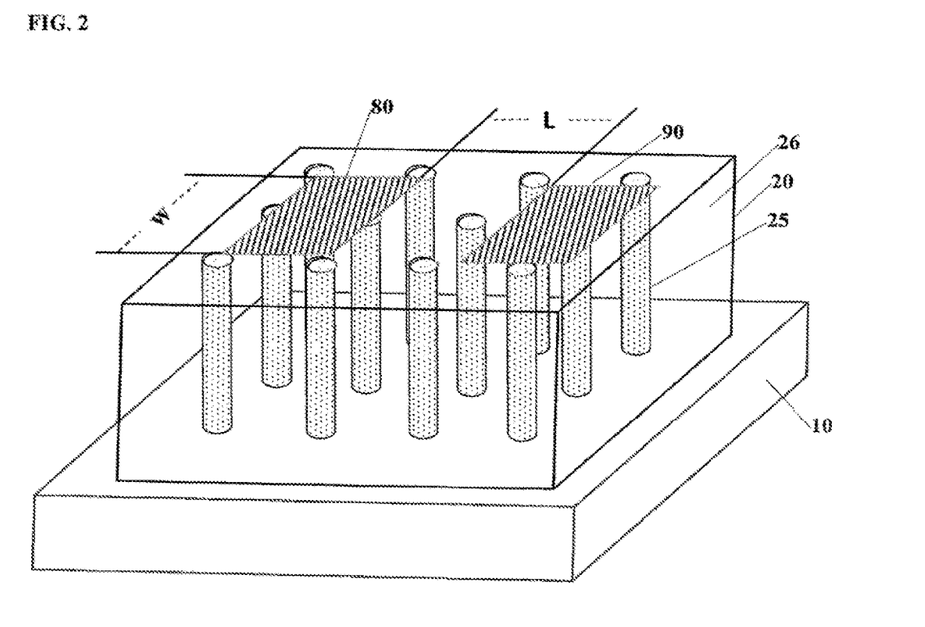
FIG. 2 is a perspective view of a thin film transistor in some embodiments according to the present disclosure.

FIG. 2 is a perspective view of a thin film transistor in some embodiments according to the present disclosure. Referring to FIG. 2, the active layer 20 is a three-dimensional nanocomposite material layer including a semiconductor material matrix 26 and a plurality of nanopillars 25 in the semiconductor material matrix 26. The plurality of nanopillars 25 extend substantially along a direction perpendicular to the base substrate 10 and the active layer 20. The active layer 20 includes a first portion corresponding to a channel region, a second portion corresponding to a source electrode contact region, and a third portion corresponding to a drain electrode contact region. In a thin film transistor having an active layer as shown in FIG. 2, a source electrode is in the source electrode contact region and is in direct contact with the second portion; and a drain electrode is in the drain electrode contact region and is in direct contact with the third portion. The source electrode and the active layer in the source electrode contact region form a source metal-semiconductor contact interface 80, the drain electrode and the active layer in the drain electrode contact region form a drain metal-semiconductor contact interface 90.

In some embodiments, the active layer has a higher percentage (by weight or by volume) of inorganic perovskite materials in the second portion and the third portion than the remaining portion of the active layer. Optionally, the active layer has a higher percentage (by weight or by volume) of inorganic perovskite materials in the second portion and the third portion than the first portion.

In some embodiments, a total number of nanopillars in the second portion and the third portion is greater than that in the remaining portion of the active layer. Optionally, a total number of nanopillars in the second portion and the third portion is greater than that in the first portion. In some embodiments, a distribution density of nanopillars in the second portion and the third portion is greater than that in the remaining portion of the active layer. Optionally, a distribution density of nanopillars in the second portion and the third portion is greater than that in the first portion.

In some embodiments, a volume ratio between the plurality of nanopillars and the semiconductor material matrix in the first portion is less than that in the second portion and the third portion. Optionally, a volume ratio between the plurality of nanopillars and the semiconductor material matrix in the second portion and the third portion is higher than that in the remaining portion of the active layer. In some embodiments, a weight ratio between the plurality of nanopillars and the semiconductor material matrix in the first portion is less than that in the second portion and the third portion. Optionally, a weight ratio between the plurality of nanopillars and the semiconductor material matrix in the second portion and the third portion is higher than that in the remaining portion of the active layer.

Optionally, the first portion is substantially free of nanopillars, e.g., free of inorganic perovskite material. Optionally, the first portion consists essentially of semiconductor material.

In some embodiments, a volume ratio between the plurality of nanopillars and the semiconductor material matrix in the active layer is in a range of approximately 3:7 to approximately 1:9. Optionally, a volume ratio between the plurality of nanopillars and the semiconductor material matrix in the second portion and the third portion is in a range of approximately 3:7 to approximately 1:9.

In some embodiments, the plurality of nanopillars comprises $LaNiO_3$, and the semiconductor material matrix comprises zinc oxide. Optionally, a volume ratio between $LaNiO_3$ and zinc oxide in the active layer is in a range of approximately 3:7 to approximately 1:9. Optionally, a volume ratio between $LaNiO_3$ and zinc oxide in the second portion and the third portion is in a range of approximately 3:7 to approximately 1:9. Optionally, a volume ratio between $LaNiO_3$ and zinc oxide in the active layer is approximately 3:7. Optionally, a volume ratio between $LaNiO_3$ and zinc oxide in the active layer is approximately 2:8. Optionally, a volume ratio between $LaNiO_3$ and zinc oxide in the active layer is approximately 1:9. Optionally, a volume ratio between $LaNiO_3$ and zinc oxide in the second portion and the third portion is approximately 3:7. Optionally, a volume ratio between $LaNiO_3$ and zinc oxide in the second portion and the third portion is approximately 2:8. Optionally, a volume ratio between $LaNiO_3$ and zinc oxide in the second portion and the third portion is approximately 1:9.

By varying the percentage (by weight or by volume) of inorganic perovskite materials, the total number of nanopillars, or the volume ratio between the plurality of nanopillars and the semiconductor material matrix, in the active layer (particularly in the second portion and the third portion), the electrical properties of the thin film transistor may be further enhanced. For example, in some embodiments, carrier mobility rate, carrier concentration, and resistivity of the active layer can be improved.

In the present thin film transistor, the active layer, e.g., at least the source electrode contact region and the drain electrode contact region, is made of a three-dimensional nanocomposite material. The nanopillars have a very high surface area-to-volume ratio, greatly facilitating injection of carriers between the active layer and the source and drain electrodes. Due to the presence of the nanopillars, injection of carriers occurs not only at the metal-semiconductor interface (e.g., the source metal-semiconductor contact interface 80 and the drain metal-semiconductor contact interface 90), but also at the nanopillar-semiconductor interface, significantly increasing the surface area for carrier injection and decreasing the metal-semiconductor resistance. In some examples, the nanopillars are made of inorganic perovskite materials, which have a relatively low resistance and a relatively high work function, effectively decreasing the metal-semiconductor resistance. As a result, the present thin film transistor has a lower threshold voltage and enhanced electrical properties. In some other examples, the inorganic perovskite material is one that does not include a rare metal element or a noble metal element, a lower manufacturing cost may be achieved.

Optionally, the thin film transistor is a thin film field effect transistor.

In some embodiments, the active layer includes a three-dimensional nanocomposite material layer having a semiconductor material matrix (e.g., ZnO) and a plurality of nanopillars (e.g., nanopillars including an inorganic perovskite material such as $LaNiO_3$) in the semiconductor material matrix, in which the inorganic perovskite material self-assembles into nanopillars. For example, the semiconductor material may be a hexagonal wurtzite crystalline material (e.g., ZnO), in which the inorganic perovskite material (e.g., $LaNiO_3$) self-assembles into nanopillars having a clear boundary with the semiconductor material matrix. By using an inorganic perovskite material having a low resistance and high work function, the contact resistance at the metal-semiconductor interface can be much lowered. Optionally, the source electrode and the source electrode contact region of the active layer form ohmic contact, and the drain electrode and the drain electrode contact region of the active layer form ohmic contact.

By forming low resistance ohmic contact between the active layer and the source and drain electrodes, additional impedance created at the metal-semiconductor interface is insignificant, and the balanced carrier concentration in the active layer is not significantly disturbed. As a result, the contact resistance at the metal-semiconductor interface can be lowered. The present thin film transistor has a lower threshold voltage and enhanced electrical properties.

In another aspect, the present disclosure provides a method of fabricating a thin film transistor having an active layer including a first portion corresponding to a channel region, a second portion corresponding to a source electrode contact region, and a third portion corresponding to a drain electrode contact region, the method includes forming the active layer. In some embodiments, the step of forming the active layer includes forming the active layer using a three-dimensional nanocomposite material including a semiconductor material matrix and a plurality of nanopillars in the semiconductor material matrix.

In some embodiments, the step of forming the active layer includes forming a first portion, and forming a second portion and a third portion. Optionally, the step of forming the first portion and the step of forming the second portion and the third portion are performed in a single process.

In some embodiments, the step of forming the active layer includes forming the second portion and the third portion using a three-dimensional nanocomposite material including a semiconductor material matrix and a plurality of nanopillars in the semiconductor material matrix. In some embodiments, the step of forming the active layer further includes forming the first portion using a three-dimensional nanocomposite material including a semiconductor material matrix and a plurality of nanopillars in the semiconductor material matrix. The step of forming the first portion and the step of forming the second portion and the third portion may be performed in a single process. Optionally, the second portion and the third portion are different from the first portion in terms of the percentage (by weight or by volume) of nanopillars in the nanocomposite material, the total number of nanopillars in the nanocomposite material, the volume ratio between the plurality of nanopillars and the semiconductor material matrix, or the weight ratio between the plurality of nanopillars and the semiconductor material matrix.

In some embodiments, the method further includes forming a source electrode in the source electrode contact region in direct contact with the second portion; and forming a drain electrode in the drain electrode contact region in direct contact with the third portion. The source electrode and the source electrode contact region of the active layer form ohmic contact, and the drain electrode and the drain electrode contact region of the active layer form ohmic contact.

In the present method, the active layer, e.g., at least the source electrode contact region and the drain electrode contact region, is formed using a three-dimensional nanocomposite material, obviating the needs of a complicated doping process in the conventional method. The active layer formed by the present method has an exceedingly low metal-semiconductor resistance, a lower threshold voltage and overall enhanced electrical properties. A much simplified fabricating process is made possible, and manufacturing costs lowered.

Various appropriate materials and various appropriate fabricating methods may be used to make the plurality of nanopillars in the semiconductor material matrix. In some embodiments, the plurality of nanopillars are made of a conductive material. Examples of appropriate materials for making the plurality of nanopillars include, but are not limited to, an inorganic perovskite material such as $LaNiO_3$, $SrRuO_3$, $La_{0.67}Sr_{0.33}MnO_3$, superconducting yttrium-barium-copper-oxygen (YBCO), and superconducting lanthanum strontium cobalt oxide (LSCO). Various appropriate materials and various appropriate fabricating methods may be used to make the base substrate. Examples of appropriate materials for making the base substrate include, but are not limited to, an inorganic perovskite material such as $SiTiO_3$. In some embodiments, the base substrate is a single crystal perovskite base substrate, e.g., a base substrate comprising a (1,1,1) oriented $SiTiO_3$ single crystal base substrate. In some embodiments, the base substrate includes a perovskite buffer layer, e.g., a $SiTiO_3$ buffer layer. Various appropriate semiconductor materials and various appropriate fabricating methods may be used to make semiconductor material matrix of the active layer. In some embodiments, the semiconductor material includes $M1O_AN_b$, wherein M1 is a single metal or a combination of metals, a>0, and b≥0, e.g., the semiconductor material is a metal oxide material or a metal oxynitride material. Examples of appropriate semiconductor materials include, but are not limited to, indium tin zinc oxide, hafnium indium zinc oxide, zinc oxide, and indium gallium zinc oxide. Various appropriate conductive electrode materials and various appropriate fabricating methods may be used to make the source electrode and the drain electrode. In some embodiments, the conductive electrode material includes a metal material. Examples of appropriate metal materials include, but are not limited to, molybdenum, gold, and aluminum.

In some embodiments, the plurality of nanopillars in the active layer (e.g., at least in the second portion and the third portion of the active layer) are formed to extend substantially along a direction perpendicular to the base substrate (or the active layer). Optionally, the plurality of nanopillars are formed to extend vertically from the base substrate, e.g., substantially perpendicularly to the base substrate. In some embodiments, the plurality of nanopillars are formed to be sandwiched between the base substrate and the source electrode in the source electrode contact region, and between the base substrate and the drain electrode in the drain electrode contact region. Optionally, the plurality of nanopillars are formed to be between the base substrate and the source electrode in the source electrode contact region so that each of the plurality of nanopillars includes a top end electrically connected to the source electrode. Optionally, the plurality of nanopillars are formed to be between the base substrate and the drain electrode in the drain electrode contact region so that each of the plurality of nanopillars includes a top end electrically connected to the drain electrode. Optionally, the plurality of nanopillars are formed to be between the base substrate and the source electrode in the source electrode contact region so that each of the plurality of nanopillars includes a bottom end electrically connected to the base substrate. Optionally, the plurality of nanopillars are formed to be between the base substrate and the drain electrode in the drain electrode contact region so that each of the plurality of nanopillars includes a bottom end electrically connected to the base substrate.

In some embodiments, the step of forming the active layer (e.g., the step of forming the second portion and the third portion or the step of forming the first portion, or both) includes co-depositing a semiconductor material and an inorganic perovskite material on a base substrate to form a composite layer including the semiconductor material and the inorganic perovskite material. Optionally, the base substrate is a single crystal perovskite base substrate or a base substrate comprising a perovskite buffer layer. Various appropriate deposition methods may be used for co-depositing the semiconductor material and the inorganic perovskite material. Examples of appropriate deposition methods for co-deposition include, but are not limited to, pulsed laser deposition, electron beam deposition, cathodic arc deposition, and the like. Optionally, the co-depositing is performed by pulsed laser deposition.

For example, a pulsed laser deposition device may be used for co-depositing the semiconductor material and the inorganic perovskite material. The pulsed laser deposition device includes a vacuum chamber, in which an inorganic perovskite material target (e.g., a $LaNiO_3$ target) and a semiconductor material target (e.g., a ZnO target) may be separately placed on a rotary bearing. A base substrate (e.g., a single crystal perovskite base substrate or a base substrate comprising a perovskite buffer layer) is placed on a heating stage in the vacuum chamber. An incident pulsed laser beam is introduced into the vacuum chamber through a laser window. The inorganic perovskite material target and the semiconductor material target are exposed to the incident pulsed laser beam. When the target is exposed to the laser beam, the target is ionized and ejected as a plasma plume. As the plasma plume reaches the base substrate, the target material is deposited on the base substrate.

Various deposition parameters may be adjusted to achieve a certain thickness of the composite layer and the volume ratio of the two targets. These parameters include, for example, deposition temperature, deposition pressure, laser pulse frequency, laser energy density, deposition duration, and the like. Optionally, the co-depositing is performed at a deposition temperature in a range of approximately 600 degrees to approximately 700 degrees, e.g., approximately 650 degrees. Optionally, the co-depositing is performed under a deposition pressure (e.g., in an oxygen atmosphere) in a range of approximately 80 mTor to approximately 120 mTor, e.g., approximately 100 mTor.

In some embodiments, the co-depositing is performed at a laser pulse frequency and a deposition duration so that a volume ratio between the plurality of nanopillars and the semiconductor material matrix is in a certain range. For example, the inorganic perovskite material target and the semiconductor material target are placed on the rotary bearing so that two targets may be exposed to the laser beam for different exposure durations or different laser pulse frequencies. Different exposure durations or different laser pulse frequencies for the inorganic perovskite material target and the semiconductor material target result in different percentages (e.g., volume percentages or weight percentages) of the inorganic perovskite material and the semiconductor material in the composite layer formed on the base substrate.

Optionally, the co-depositing is performed at a laser pulse frequency and a deposition duration so that a volume ratio between the plurality of nanopillars and the semiconductor material matrix is in a range of approximately 3:7 to approximately 1:9, e.g., approximately 3:7 to approximately 2:8, approximately 2:8 to approximately 1:9. Optionally, the co-depositing is performed at a laser pulse frequency and a deposition duration so that the volume ratio is approximately 3:7. Optionally, the co-depositing is performed at a laser pulse frequency and a deposition duration so that the volume ratio is approximately 2:8. Optionally, the co-depositing is performed at a laser pulse frequency and a deposition duration so that the volume ratio is approximately 1:9.

For example, in some embodiments, a perovskite material including $LaNiO_3$ and a semiconductor material including zinc oxide is co-deposited on the base substrate. Optionally, the co-depositing is performed at a laser pulse frequency and a deposition duration so that a volume ratio between $LaNiO_3$ nanopillars and a zinc oxide matrix is in a range of approximately 3:7 to approximately 1:9, e.g., approximately 3:7 to approximately 2:8, approximately 2:8 to approximately 1:9. Optionally, the co-depositing is performed at a laser pulse frequency and a deposition duration so that the volume ratio is approximately 3:7. Optionally, the co-depositing is performed at a laser pulse frequency and a deposition duration so that the volume ratio is approximately 2:8. Optionally, the co-depositing is performed at a laser pulse frequency and a deposition duration so that the volume ratio is approximately 1:9.

In some embodiments, the co-depositing in the first portion is performed at a laser pulse frequency and a deposition duration different than that for the co-depositing in the second portion and the third portion so that the active layer so formed has a higher percentage (by weight or by volume) of inorganic perovskite materials in the second portion and the third portion than the remaining portion of the active layer. Optionally, the active layer is formed to have a higher percentage (by weight or by volume) of inorganic perovskite materials in the second portion and the third portion than the first portion.

In some embodiments, the co-depositing in the first portion is performed at a laser pulse frequency and a deposition duration different than that for the co-depositing in the second portion and the third portion so that a total number of nanopillars in the second portion and the third portion is greater than that in the remaining portion of the active layer. Optionally, the co-depositing in the first portion is performed at a laser pulse frequency and a deposition duration different than that for the co-depositing in the second portion and the third portion so that a total number of nanopillars in the second portion and the third portion is greater than that in the first portion. In some embodiments, the co-depositing in the first portion is performed at a laser pulse frequency and a deposition duration different than that for the co-depositing in the second portion and the third portion so that a distribution density of nanopillars in the second portion and the third portion is greater than that in the remaining portion of the active layer. Optionally, the co-depositing in the first portion is performed at a laser pulse frequency and a deposition duration different than that for the co-depositing in the second portion and the third portion so that a distribution density of nanopillars in the second portion and the third portion is greater than that in the first portion.

In some embodiments, the co-depositing in the first portion is performed at a laser pulse frequency and a deposition duration different than that for the co-depositing in the second portion and the third portion so that a volume ratio between the plurality of nanopillars and the semiconductor material matrix in the first portion is less than that in the second portion and the third portion. Optionally, the co-depositing in the first portion is performed at a laser pulse frequency and a deposition duration different than that for the co-depositing in the second portion and the third portion so that a volume ratio between the plurality of nanopillars and the semiconductor material matrix in the second portion and the third portion is higher than that in the remaining portion of the active layer. In some embodiments, the co-depositing in the first portion is performed at a laser pulse frequency and a deposition duration different than that for the co-depositing in the second portion and the third portion so that a weight ratio between the plurality of nanopillars and the semiconductor material matrix in the first portion is less than that in the second portion and the third portion. Optionally, the co-depositing in the first portion is performed at a laser pulse frequency and a deposition duration different than that for the co-depositing in the second portion and the third portion so that a weight ratio between the plurality of nanopillars and the semiconductor material matrix in the second portion and the third portion is higher than that in the remaining portion of the active layer.

Optionally, the first portion is formed to be substantially free of nanopillars, e.g., free of inorganic perovskite material. Optionally, the first portion consists essentially of semiconductor material.

In the present method, inorganic perovskite materials, having a relatively low resistance and a relatively high work function, are used for making the nanopillars. Metal-semiconductor resistance in a thin film transistor made by the present method can be effectively decreased. As a result, the thin film transistor fabricated according to the present method has a lower threshold voltage and enhanced electrical properties. In some examples, the inorganic perovskite material is one that does not include a rare metal element or a noble metal element, a lower manufacturing cost may be achieved.

In some embodiments of the present method, the active layer is formed to include a three-dimensional nanocomposite material having a semiconductor material matrix (e.g., ZnO) and a plurality of nanopillars (e.g., nanopillars including an inorganic perovskite material such as $LaNiO_3$) in the semiconductor material matrix, in which the inorganic perovskite material self-assembles into nanopillars. For example, the semiconductor material may be a hexagonal wurtzite crystalline material (e.g., ZnO), in which the inorganic perovskite material (e.g., $LaNiO_3$) self-assembles into nanopillars. The nanopillars so formed have a clear boundary with the semiconductor material matrix. By using an inorganic perovskite material having a low resistance and high work function, ohmic contact between the source electrode and the source electrode contact region of the active layer and between the drain electrode and the drain electrode contact region of the active layer can be achieved, and the contact resistance at the metal-semiconductor interface can be much lowered.

In the present method, by varying the percentage (by weight or by volume) of inorganic perovskite materials, the total number of nanopillars, or the volume ratio between the plurality of nanopillars and the semiconductor material matrix, in the active layer (particularly in the second portion and the third portion), the electrical properties of the thin film transistor may be further enhanced. For example, in some embodiments, carrier mobility rate, carrier concentration, and resistivity of the active layer can be improved.

In the present method, by forming low resistance ohmic contact between the active layer and the source and drain electrodes, additional impedance created at the metal-semiconductor interface is insignificant, and the balanced carrier concentration in the active layer is not significantly disturbed. As a result, the contact resistance at the metal-semiconductor interface can be lowered. The thin film transistor fabricated by the present method has a lower threshold voltage and enhanced electrical properties.

In one example, the active layer includes a three-dimensional nanocomposite material including a semiconductor material matrix and a plurality of nanopillars in the semiconductor material matrix. The active layer includes 80% zinc oxide and 20% $LaNiO_3$. The active layer includes a single crystal perovskite base substrate, an active layer including zinc oxide and $LaNiO_3$ on the base substrate, a gate insulating layer on a side of the active layer distal to the base substrate, and a gate electrode on a side of the gate insulating layer distal to the active layer.

In one example, the method includes cleaning the single crystal perovskite base substrate. In another example, the method includes depositing a perovskite buffer layer on a silicon base substrate. Once a suitable base substrate is prepared, zinc oxide and $LaNiO_3$ are co-deposited on the base substrate, e.g., by pulsed laser deposition of a zinc oxide target and a $LaNiO_3$; target. The laser pulse frequency and deposition duration for the pulsed laser deposition are adjusted so that a volume ratio between zinc oxide and $LaNiO_3$ deposited on the base substrate is 8:2. Specifically, the co-depositing is performed at a deposition temperature in a range of approximately 600 degrees to approximately 700 degrees (e.g., 650 degrees), in an oxygen atmosphere under a pressure in a range of approximately 80 mTor to approximately 120 mTor (e.g., 100 mTor). The deposition duration is adjusted so that a thickness of the composite layer is in a range of approximately 100 nm to approximately 200 nm (e.g., 150 nm). Subsequently, the composite layer is patterned to form the active layer. An insulating material is deposited by chemical vapor deposition method to form a gate insulating layer on the base substrate having the active layer. The gate insulating layer has a thickness in a range of approximately 100 nm to approximately 200 nm, e.g., 150 nm. A molybdenum metal material is then deposited by sputtering on the base substrate to form a molybdenum metal material layer, which is patterned to form a gate electrode. The gate electrode has a thickness in a range of approximately 150 nm to approximately 250 nm, e.g., 200 nm. A silicon oxide material is deposited on the base substrate having the gate electrode to form a passivation layer having a thickness in a range of approximately 100 nm to approximately 500 nm. The base substrate is subsequently etched to form a source via and a drain via each extending through the passivation layer and the gate insulating layer. A molybdenum metal material is deposited on the base substrate by sputtering to form a molybdenum metal material layer. The molybdenum metal material layer is patterned to form a source electrode and a drain electrode. The source electrode is electrically connected to the source electrode contact region in the active layer through the source via. The drain electrode is electrically connected to the drain electrode contact region in the active layer through the drain via. The volume ratio of zinc oxide and $LaNiO_3$ in the active layer can be varied by changing the co-deposition parameters.

Figure 3:
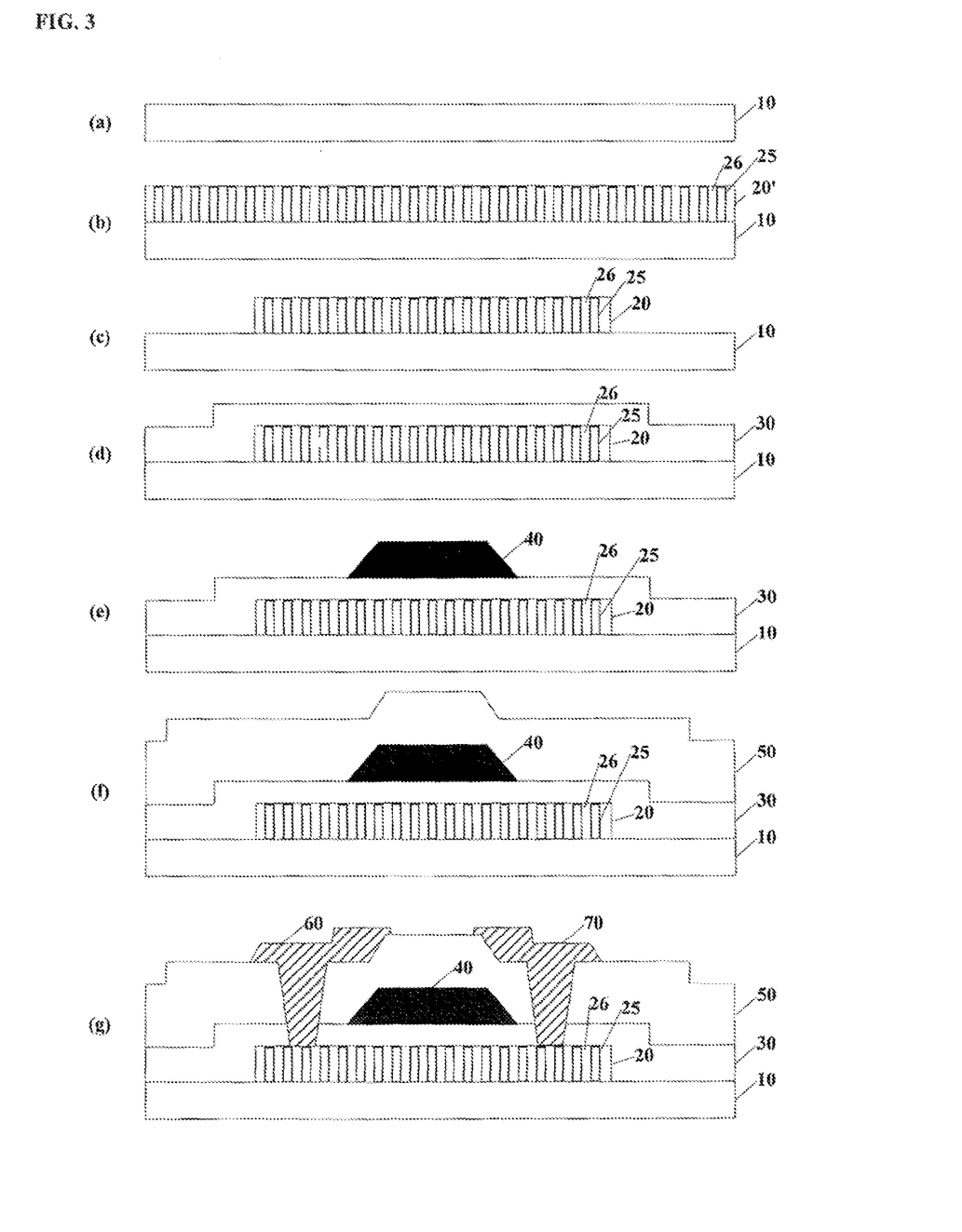
FIG. 3 is a flow chart illustrating a process of fabricating a thin film transistor in some embodiments according to the present disclosure.

FIG. 3 illustrates a process of fabricating a thin film transistor in some embodiments according to the present disclosure. Referring to FIG. 3A, the method in some embodiments includes cleaning a base substrate 10. Referring to FIG. 3B, the method in some embodiments includes co-depositing zinc oxide and $LaNiO_3$ by a pulsed laser deposition process to form a self-assembled three-dimensional nanocomposite material layer 20'. Depending on the desired volume ratio between zinc oxide and $LaNiO_3$, deposition parameters such as deposition duration and laser pulse frequency can be determined. As shown in FIG. 3B, the self-assembled three-dimensional nanocomposite material layer 20' includes a semiconductor material matrix 26 and a plurality of nanopillars 25 in the semiconductor material matrix 26.

Referring to FIG. 3C, the self-assembled three-dimensional nanocomposite material layer 20 is patterned by lithography to obtain an active layer 20. The active layer 20 includes a first portion corresponding to a channel region, a second portion corresponding to a source electrode contact region, and a third portion corresponding to a drain electrode contact region. The active layer 20 is a three-dimensional nanocomposite material layer including a semiconductor material matrix 26 and a plurality of nanopillars 25 in the semiconductor material matrix 26.

The method further includes forming a gate insulating layer 30 on a side of the active layer 20 distal to the base substrate 10 (FIG. 3D), forming a gate electrode 40 on a side of the gate insulating layer 30 distal to the active layer 20 (FIG. 3E), forming a passivation layer 50 on a side of the gate electrode 40 distal to the gate insulating layer 30 (FIG. 3F), and forming a source electrode 60 and a drain electrode 70 on a side of the passivation layer 50 distal to the gate electrode 40 (FIG. 3G). Prior to the step of forming the source electrode and the drain electrode, the method further includes a first via and a second via respectively extending through the passivation layer 50 and the gate insulating layer 30, the source electrode 60 being in contact with the active layer 20 through the first via, and the drain electrode 70 being in contact with the active layer 20 through the second via. The thin film transistor illustrated in FIG. 3 is a top gate-type thin film transistor. Optionally, the present thin film transistor may be a thin film transistor in a bottom gate-type thin film transistor.

In another aspect, the present disclosure provides an array substrate having a thin film transistor described herein or fabricated by a method described herein.

In another aspect, the present disclosure provides a display panel having an array substrate described herein.

In another aspect, the present disclosure provides a display apparatus having a display panel described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A thin film transistor comprising a base substrate and an active layer on the base substrate having a first portion corresponding to a channel region, a second portion corresponding to a source electrode contact region, and a third portion corresponding to a drain electrode contact region;
   wherein the second portion and the third portion comprise
   a three-dimensional nanocomposite material comprising a semiconductor material matrix and a plurality of nanopillars in the semiconductor material matrix;
   a respective one of the plurality of nanopillars has an elongated shape, a longitudinal direction of the elongated shape substantially perpendicular to the base substrates;
   a respective one of the plurality of nanopillars in the second portion has a top end electrically connected to and in direct contact with a source electrode of the thin film transistor, and a bottom end electrically connected to and in direct contact with the base substrate; and
   a respective one of the plurality of nanopillars in the third portion has a top end electrically connected to and in direct contact with a drain electrode of the thin film transistor, and a bottom end electrically connected to and in direct contact with the base substrate.

2. The thin film transistor of claim 1, wherein the plurality of nanopillars comprises an inorganic perovskite material.

3. The thin film transistor of claim 2, wherein the inorganic perovskite material comprises one of $LaNiO_3$, $SrRuO_3$, $La_{0.67}Sr_{0.33}MnO_3$, superconducting yttrium-barium-copper-oxygen (YBCO), and superconducting lanthanum strontium cobalt oxide (LSCO).

4. The thin film transistor of claim 1, wherein the semiconductor material matrix comprises a semiconductor material comprising $M1O_aN_b$, wherein M1 is a single metal or a combination of metals, $a>0$, and $b \geq 0$.

5. The thin film transistor of claim 4, wherein the semiconductor material matrix comprises one or more of indium tin zinc oxide, hafnium indium zinc oxide, zinc oxide, and indium gallium zinc oxide.

6. The thin film transistor of claim 1, wherein a volume ratio between the plurality of nanopillars and the semiconductor material matrix is in a range of approximately 3:7 to approximately 1:9.

7. The thin film transistor of claim 6, wherein the plurality of nanopillars comprises $LaNiO_3$, and the semiconductor material matrix comprises zinc oxide; and
   a volume ratio between $LaNiO_3$ and zinc oxide is in a range of approximately 3:7 to approximately 1:9.

8. The thin film transistor of claim 1, further comprising a source electrode in the source electrode contact region in direct contact with the second portion; and a drain electrode in the drain electrode contact region in direct contact with the third portion;
   wherein the source electrode and the drain electrode are made of a metal material.

9. The thin film transistor of claim 8, wherein the source electrode and the drain electrode comprises one or more of molybdenum, gold, and aluminum.

10. The thin film transistor of claim 1, wherein the first portion comprise a three-dimensional nanocomposite material comprising a semiconductor material matrix and a plurality of nanopillars in the semiconductor material matrix; and
    a volume ratio between the plurality of nanopillars and the semiconductor material matrix in the first portion is less than that in the second portion and the third portion.

11. The thin film transistor of claim 1, wherein the first portion comprise a three-dimensional nanocomposite material comprising a semiconductor material matrix and a plurality of nanopillars in the semiconductor material matrix; and
    a distribution density of nanopillars in the second portion and the third portion is greater than that in the first portion.

12. The thin film transistor of claim 1, wherein the base substrate is a single crystal perovskite base substrate or a base substrate comprising a perovskite buffer sub-layer.

13. The thin film transistor of claim 12, wherein the single crystal perovskite base substrate or the perovskite buffer sub-layer comprises $SiTiO_3$.

14. A display panel, comprising a thin film transistor of claim 1.

15. A method of fabricating a thin film transistor having an active layer including a first portion corresponding to a channel region, a second portion corresponding to a source electrode contact region, and a third portion corresponding to a drain electrode contact region;
    the method comprising forming the active layer on a base substrate;
    wherein forming the active layer comprises forming the second portion and the third portion using a three-dimensional nanocomposite material comprising a semiconductor material matrix and a plurality of nanopillars in the semiconductor material matrix;
    a respective one of the plurality of nanopillars is formed to have an elongated shape, a longitudinal direction of the elongated shape substantially perpendicular to the base substrate;
    a respective one of the plurality of nanopillars in the second portion is formed to have a top end electrically connected to and in direct contact with a source electrode of the thin film transistor, and a bottom end electrically connected to and in direct contact with the base substrate; and
    a respective one of the plurality of nanopillars in the third portion is formed to have a top end electrically connected to and in direct contact with a drain electrode of the thin film transistor, and a bottom end electrically connected to and in direct contact with the base substrate.

16. A method of fabricating a thin film transistor having an active layer including a first portion corresponding to a channel region, a second portion corresponding to a source electrode contact region, and a third portion corresponding to a drain electrode contact region;
    the method comprising forming the active layer on a base substrate;

wherein forming the active layer comprises forming the second portion and the third portion using a three-dimensional nanocomposite material comprising a semiconductor material matrix and a plurality of nanopillars in the semiconductor material matrix;

wherein the plurality of nanopillars are formed to extend substantially along a direction perpendicular to the base substrate; and the plurality of nanopillars are formed using an inorganic perovskite material;

wherein forming the active layer comprises:

co-depositing a semiconductor material and the inorganic perovskite material on the base substrate to form a three-dimensional nanocomposite composite layer comprising the semiconductor material and the inorganic perovskite material; and the base substrate is a single crystal perovskite base substrate or a base substrate comprising a perovskite buffer layer;

wherein the co-depositing is performed by pulsed laser deposition during which the inorganic perovskite material self-assembles into the plurality of nanopillars in the semiconductor material matrix.

17. The method of claim 16, wherein the pulsed laser deposition is performed at a laser pulse frequency and a deposition duration so that a volume ratio between the plurality of nanopillars and the semiconductor material matrix is in a range of approximately 3:7 to approximately 1:9.

18. The method of claim 16, wherein the pulsed laser deposition is performed at a deposition temperature in a range of approximately 600 degrees to approximately 700 degrees, and in an oxygen atmosphere under a pressure in a range of approximately 80 mTor to approximately 120 mTor.

* * * * *